United States Patent [19]

Donley et al.

[11] 4,368,349

[45] * Jan. 11, 1983

[54] FLASHER CONTROLLER FOR VEHICLE LIGHTS

[76] Inventors: Robert P. Donley, 2500 Lane Rd.; Terry Dawson, 1367 Crestview, both of Columbus, Ohio 43221

[*] Notice: The portion of the term of this patent subsequent to May 19, 1998, has been disclaimed.

[21] Appl. No.: 262,200

[22] Filed: May 11, 1981

[51] Int. Cl.³ .............................................. H05K 5/00
[52] U.S. Cl. ........................... 174/52 PE; 264/272.11; 340/81 R
[58] Field of Search .................... 174/52 PE, 52 S, 51; 339/14 R, 17 R, 17 B, 17 E; 337/112, 121; 335/202; 29/627; 264/272.11, 272.14; 315/200 A; 361/399; 340/81 R

[56] References Cited
U.S. PATENT DOCUMENTS 4,268,713  5/1981  Donley et al. ................ 174/52 PE Primary Examiner—A. T. Grimley
Assistant Examiner—D. A. Tone

[57] ABSTRACT

A flasher controller for vehicle warning lights that comprises a housing for a circuit board that electrically controls the device. The apparatus includes a mounting strap of conductive material which includes an internal ground connection with the circuit board and a mounting flange external of the housing that functions as the external ground connection for the circuit board. The housing is filled with a resinous material that functions as a weatherproof seal, as well as means for securing the mounting strap to the housing. The device is adapted to automatically sequentially operate and flash either amber or red warning lights on the vehicle in accordance with a plurality of selectable programs. The control functions are effected entirely by solid state electrical components which are potted together with the mounting strap.

6 Claims, 5 Drawing Figures

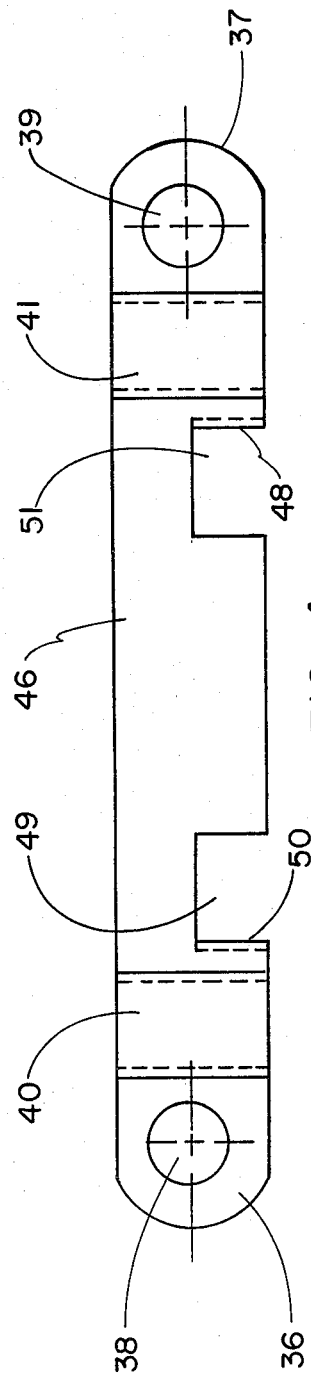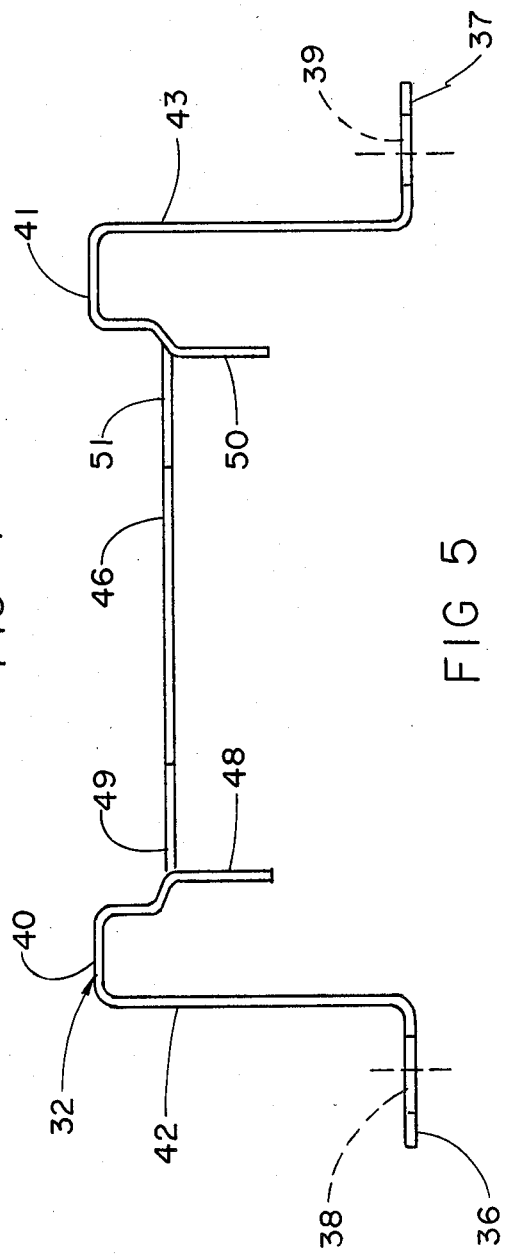

FLASHER CONTROLLER FOR VEHICLE LIGHTS

BACKGROUND OF THE INVENTION

This application generally relates to flasher controllers for vehicle lights and more particularly to an improved method and apparatus for assembly and sealing the components of such an apparatus.

PROBLEMS IN THE ART

In the use of high intensity flasher controllers, such as are used on school busses, farm machinery and the like, a problem has been present, in that water damage is the common cause of failure of the electrical components. These devices are commonly subjected to moisture from the environment. In the case of school busses, the flasher controllers are commonly mounted under the dashboards, and the interior of the busses are frequently washed with a hose, whereby the flasher controllers become subjected to water damage.

SUMMARY OF THE INVENTION

In general the present invention comprises a novel flasher controller for bus lighting systems and a method of making same, wherein a main housing is used to form a cavity for enclosing the circuit board. A mounting strap for securing the device to the vehicle frame is formed of electrically conductive metal and provided with an internal ground connection that plugs into a ground connection on the circuit board; as well as an external mounting flange that serves the additional function as the external ground connection for the control circuit. A potting material, such as an epoxy resin, is poured into the cavity in surrounding relationship with the circuit board and internal portion of the ground strap, so as to provide a positive weather-proof seal for the electrical components, as well as means for securing the mounting strap to the housing.

It is another aspect of the present invention to provide a flasher controller of the type described wherein the control circuit board is provided with up-standing connectors which extend to the exterior of the main housing to form plug connectors, and which are embedded in the resinous material, so as to be sealed and reenforced thereby.

It is another aspect of the present invention to provide a flasher controller of the type described adapted for automatically sequentially operating and flashing either amber or red lights responsive to door switch actuation, with all components of the controller being effected by solid state components which are potted together as a unit.

It is another aspect of the present invention to provide a flasher controller of the type described that is adapted for selective use as a stop arm controller.

It is another aspect of the present invention to provide a flasher controller of the type described that is adapted for the selective externally effected by-pass of certain control functions of the internal light control sequence. This facilitates compliance with variations in state laws relating to light displays at railroad crossings.

It is therefore a primary object of the present invention to provide a novel flasher controller and method of fabricating same, wherein the components are assembled in a unique manner, so as to provide positive moisture protection for the electrical components.

It is another object of the present invention to provide an apparatus of the type described wherein the components are secured together with high structural integrity.

Further objects and advantages of the present invention will be apparent from the following description, reference being had to the accompanying drawings wherein preferred forms of the embodiments of the invention are clearly shown.

BRIEF DESCRIPTIONS OF THE DRAWINGS

FIG. 4 is a top elevational view of a mounting strap comprising a portion of the apparatus of the preceding figures and;

FIG. 5 is a side elevational view corresponding to FIG. 4.

Figure 1:
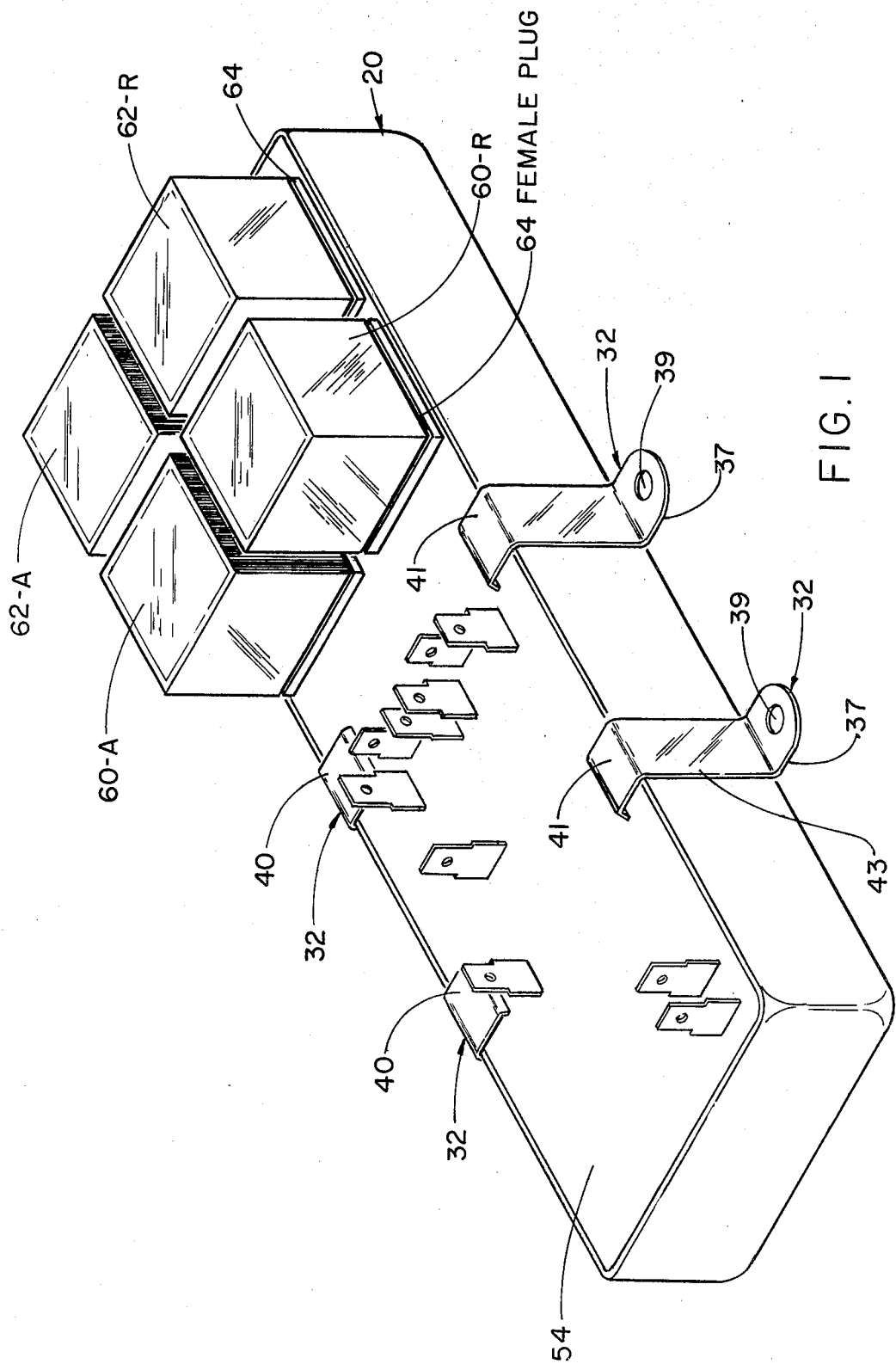
FIG. 1 is a perspective view of a flasher controller constructed in accordance with the present invention.
Figure 2:
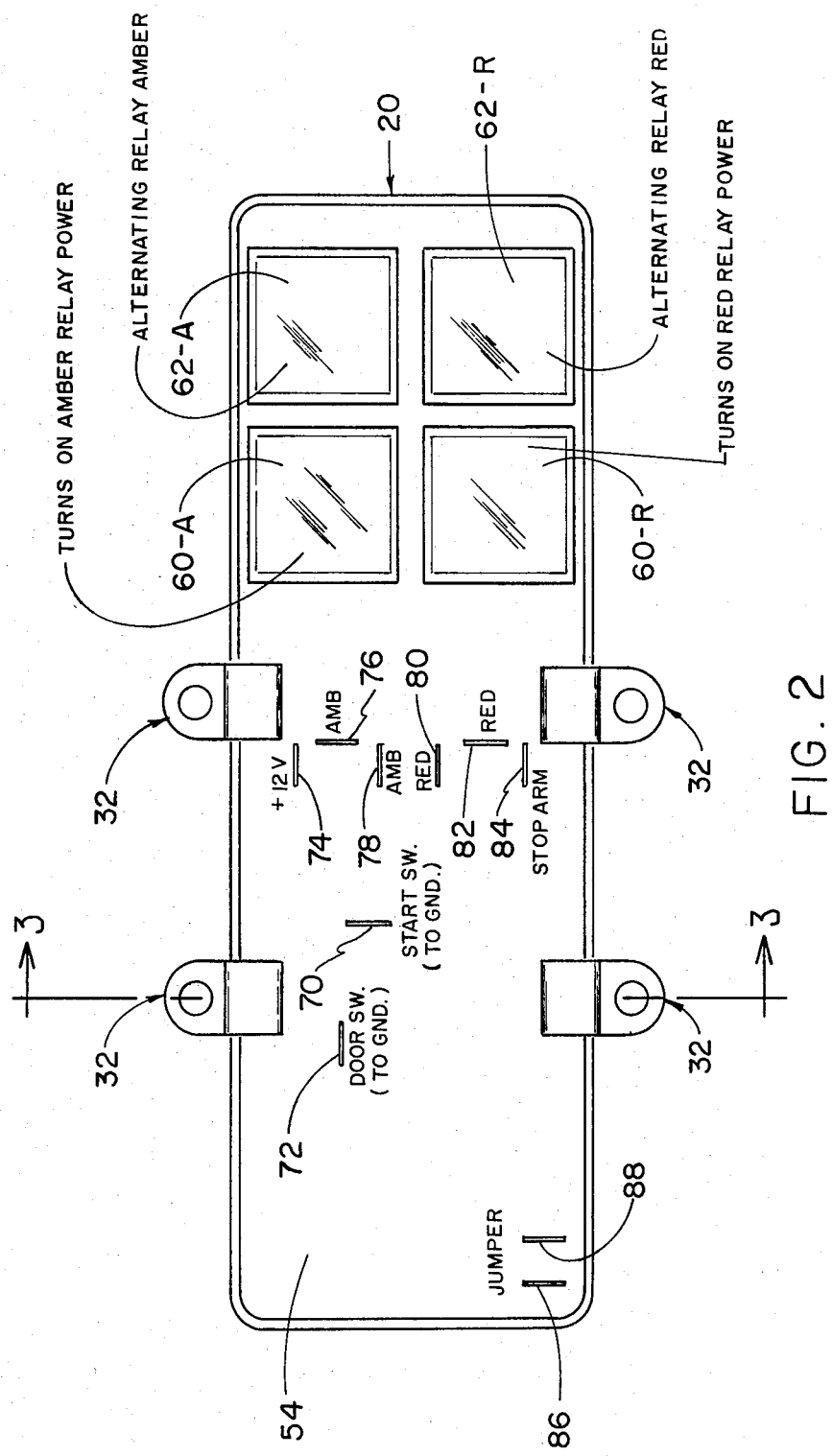
FIG. 2 is a top elevational view of the flasher controller of FIG. 1.
Figure 3:
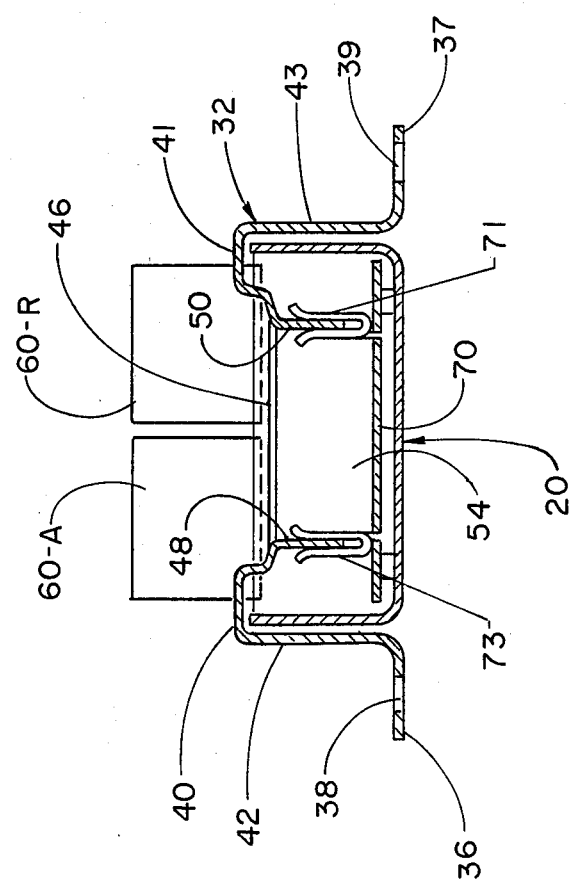
FIG. 3 is an end sectional view of the apparatus of the proceeding figures, with the section being taken along a vertical plane through the center of the apparatus.

Referring in detail to the drawings, the flasher controller of the present invention comprises a main housing indicated generally at 20 in FIGS. 1–3 which forms a cavity for receiving a circuit board indicated at 70 in FIG. 3.

The housing 20 is secured to the vehicle frame by two mounting and grounding means or straps indicated generally at 32 and shown in assembled relationship with housing 20 in FIGS. 1–3. As seen in FIGS. 3–5, each strap 32 includes flanges or shoulders 48 and 50 which form inner strap ground terminals, with such flanges being bent from a central strap portion 46. One end of strap 32 includes external flanges 41, 43 and 37, with flange 37 including a mounting hole 39 for receiving a mounting screw not illustrated. The other end of mounting strap 32 includes external flange portion 40, 42 and 36 with flange 36 including a second mounting hole 38. It will now be understood that the exterior mounting flanges 36 and 37 form the external ground connections for circuit board 70, since mounting strap 32 is made from electrically conductive sheet metal material and since the internal flanges 48 and 50 are plugged into circuit board ground terminal 71 and 73 which extend upwardly from board 70, as seen in FIG. 3.

After the ground straps 32 are positioned on the housing 20, as seen in FIGS. 1–3 the cavity of the housing is poured full of a suitable insulating compound 54 such as epoxy resin, such that the compound surrounds the circuit board and internal portions of mounting strap 32, including the internal ground connections 50 and 71, and 48 and 73, thereby securing the ground strap securely to housing 20.

Referring again to FIGS. 1–3, the apparatus includes four plug-in type relays 60-A, 62-A, 60-B and 62-B. Each relay is removeably mounted in respective female receptical 64, which is connected to the circuit on circuit board 70, with each receptical being potted in compound 54.

Relay 60-A and 62-A control two amber lights on the vehicle relay 60-A being an on-off switch for energizing its companion relay 62-A which is an alternating relay that alternatingly flashes the two amber lights.

In the same manner relays 60-R and 62-R control two red lights on the vehicle with relay 60-R being an on-off switch for energizing its companion relay 62-R, the latter being an alternating relay that alternatingly flashes the two red lights.

Referring particularly to FIG. 2, the apparatus includes ten plug in terminals, formed by ten upstanding conductors 70-88, each of which includes a lower end connected to the circuit on circuit board 70 and an upper end extending above compound 54, so as to form a plug in connection with an external circuit component.

Referring again to FIG. 2, conductor 70 is connected to a remote start switch, not illustrated, which is mounted on the vehicle dash board and is turned on and off by the driver of the vehicle.

Conductor 72 leads to a remote door switch, not illustrated, which is actuated by openeing and closing of the vehicle door.

The two amber conductors 74 and 76 are respectively connected to the two previously mentioned amber lights and red conductors 80 and 82 are respectively connected to the two red lights mentioned above.

Another conductor 84 is provided for the selective connection of a stop arm operator for extending and retracting a conventional stop arm such as are mounted on the sides of school busses in locations where such are required by state law.

Two jumper conductors 86 and 88 are provided, so as to make a single standardized flasher controller selectively adaptable to two different automatic control sequences. This is adventageous since some state laws prohibit a bus from flashing red lights, when stopped at a railroad crossing, whereas, other states require the use of flashing red lights under the same circumstances. Hence, the circuit of the present apparatus is programmed such that when jumper conductors 86 and 88 are open the red lights will not go on when the driver re-opens the vehicle door, when stopped at a railroad crossing.

When the jumper conductors 86 and 88 are connected by a jumper, however, the red lights will go on every time the vehicle door is opened, including when stopped at a railroad crossing.

In operation, the two sequences which are selectively effected by the present flasher controller are as follows:

SEQUENCE A - JUMPER CONDUCTORS OPEN

1. Driver actuates start switch—amber light goes on.
2. Opens door—amber lights go off, red lights go on.
3. Closes door—red lights go off.
4. Opens door—no lights go on.
5. Actuates switch with door open—red lights go on.
6. Closes door—red lights go off.

SEQUENCE B - JUMPER CONDUCTORS CLOSED

1. Same as sequence A.
2. Same as Sequence A.
3. Same as sequence A.
4. Opens door—red lights go off.

It should be mentioned that in both sequences a stop arm actuator, where required, is connected at conductor 84 and the controller the functions to extend the stop arm each time the red lights go on and retract the stop arm each time the red lights go off.

It should also be mentioned that the conductors 70 thru 84, excepting conductor 74, are all positive terminals leading to an external circuit accessory which is in turn grounded to the vehicle frame.

While the form of embodiment of the present invention as herein disclosed constitutes a preferred form, it is to be understood that other forms might be adopted.

We claim:

1. A controller for sequentially operating a plurality of vehicle lights comprising, in combination a circuit board housing including spaced sidewalls and a bottom wall forming a cavity; a circuit board positioned in the cavity and including a circuit board ground terminal; an electrically conductive mounting and grounding means including an internal flange forming a second ground terminal engaging said circuit board ground terminal, an intermediate flange extending to the exterior of said cavity, and an external flange extending beyond a side wall and forming a housing supporting mount for connection with a vehicle in grounded relationship therewith; a plurality of upstanding conductors, each of which includes a lower end mounted on the circuit board and an upper end connector for attachment to external circuit elements, said conductors comprising the following:

1. battery conductor,
2. amber light conductors
3. red light conductors
4. start switch conductor,
5. door switch conductor, and a resinous insulating and sealing material within said cavity in sealed surrounding relationship with said engaging ground terminals and said lower ends of said upstanding conductors.

2. The controller defined in claim 1, wherein said plurality of upstanding conductors includes a stop arm conductor for selective connection with a stop arm operator.

3. The controller defined in claim 1, wherein said plurality of upstanding conductors includes a pair of jumper conductors for selective external by-pass of an internal light control function.

4. The steps in the method of fabricating an electrical controller for a light flasher system, said method comprising positioning a circuit board within the cavity of a cup-shaped circuit board housing, with the board including a circuit board ground terminal; a plurality of upstanding conductors, each of which includes a lower end mounted on the circuit board and an upper end connector for attachment to external circuit elements, said conductors comprising the following:

1. battery conductor,
2. amber light conductors
3. red light conductors
4. start switch conductor,
5. door switch conductor, positioning a conductive mounting strap adjacent to the circuit board housing with an internal flange portion of the strap extending to the exterior of the cavity, and an external flange portion of the strap extending beyond a side wall of the housing and forming a shoulder for mounting and grounding the controller; and filling the cavity with a dielectric potting compound so as to surround the circuit board and secure the mounting strap to the circuit board housing with the upper end connectors of the upstanding conductors being extended beyond the potting compound.

5. The method of claim 4 wherein the plurality of upstanding conductors includes a stop arm conductor for selective connection with a stop arm operator.

6. The method of claim 4 wherein the plurality of upstanding conductors includes a pair of jumper conductors for selective external by-pass of an internal light control function.

* * * * *